US008427827B2

(12) United States Patent
Kamimura

(10) Patent No.: US 8,427,827 B2
(45) Date of Patent: Apr. 23, 2013

(54) FLOW RECTIFYING COOLING APPARATUS AND A METHOD FOR RECTIFYING FLOW IN A COOLING APPARATUS

(75) Inventor: Takuroh Kamimura, Fujisawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 221 days.

(21) Appl. No.: 12/940,661

(22) Filed: Nov. 5, 2010

(65) Prior Publication Data

US 2012/0113588 A1 May 10, 2012

(51) Int. Cl.
*H05K 7/20* (2006.01)

(52) U.S. Cl.
USPC ............ 361/679.48; 361/679.47; 361/679.55; 361/695; 361/688; 361/689; 165/121; 165/122; 165/126; 165/185; 415/223; 415/208.1; 415/204; 415/206; 415/215.1

(58) Field of Classification Search ............... 361/679.46–679.53, 688, 689, 361/690–697, 700–712, 715, 717–724; 165/80.2, 165/80.3, 80.4, 80.5, 121, 122, 104.33, 104.34, 165/185; 415/58.2–58.4, 58.6, 119, 146, 415/1, 170.1, 172, 173.1, 173.5, 174.5, 184, 415/204, 206; 417/423.1, 423.13, 423.7; 454/184; 416/184, 204 R, 186 R, 223 B, 416/182

See application file for complete search history.

(56) References Cited

U.S. PATENT DOCUMENTS

| | | | |
|---|---|---|---|
| 4,775,294 A | 10/1988 | LaPorte | |
| 5,215,437 A * | 6/1993 | TeVelde et al. | 415/223 |
| 5,813,831 A * | 9/1998 | Matsunaga et al. | 415/173.6 |
| 6,042,335 A * | 3/2000 | Amr | 415/208.1 |
| 6,964,555 B2 * | 11/2005 | Ochiai et al. | 415/204 |
| 7,163,371 B2 * | 1/2007 | Higashida | 415/204 |
| 7,207,774 B2 * | 4/2007 | Kashiwazaki et al. | 415/206 |
| 7,443,670 B2 * | 10/2008 | Nishi et al. | 361/695 |
| 7,476,076 B2 * | 1/2009 | Shimada | 415/58.4 |
| 7,643,284 B2 * | 1/2010 | Nakamura | 361/679.47 |
| 7,758,305 B2 * | 7/2010 | Kurszewski et al. | 415/205 |
| 2003/0012649 A1 * | 1/2003 | Sakai et al. | 415/206 |
| 2004/0131465 A1 * | 7/2004 | Ochiai et al. | 415/206 |
| 2004/0240994 A1 * | 12/2004 | Cole et al. | 415/215.1 |
| 2008/0112130 A1 * | 5/2008 | Nakamura | 361/687 |
| 2010/0183433 A1 * | 7/2010 | Sinzaki | 415/204 |

FOREIGN PATENT DOCUMENTS

| | | | | |
|---|---|---|---|---|
| EP | 001357296 A1 | * | 10/2003 | |
| JP | 357093700 A | * | 6/1982 | |
| JP | 1993-247062 A | | 7/1994 | |
| JP | 411062896 A | * | 3/1999 | |
| JP | 2001050193 A | * | 2/2001 | |
| JP | 2007247444 A | * | 9/2007 | |
| TW | 200920948 A | * | 5/2009 | |

* cited by examiner

*Primary Examiner* — Michail V Datskovskiy
(74) *Attorney, Agent, or Firm* — Nutter McClennen & Fish LLP; John J. Penny, Jr.; Christina M. Sperry

(57) ABSTRACT

A cooling apparatus comprising an impeller, a housing that encloses the impeller, an inlet opening formed between the hosing and impeller and a projection formed on the housing that extends from the housing towards the impeller.

16 Claims, 23 Drawing Sheets

FIG. 7E

| Embodiment A | Before | After | Δ |
|---|---|---|---|
| Low [25dB(A)] | 2950rpm | 3100rpm | +150rpm |
| Middle [28dB(A)] | 3200rpm | 3400rpm | +200rpm |
| High [32dB(A)] | 3750rpm | 3850rpm | +100rpm |

FIG. 8E

| Embodiment B | Before | After | Δ |
|---|---|---|---|
| Low [25dB(A)] | 2800rpm | 2900rpm | +100rpm |
| Middle [28dB(A)] | 3150rpm | 3200rpm | +50rpm |
| High [32dB(A)] | 3550rpm | 3700rpm | +150rpm |

FIG. 9E

| Embodiment C | Before | After | Δ |
|---|---|---|---|
| Low [25dB(A)] | 3950rpm | 4100rpm | +150rpm |
| Middle [28dB(A)] | 4200rpm | 4450rpm | +250rpm |
| High [32dB(A)] | 4850rpm | 5000rpm | +150rpm |

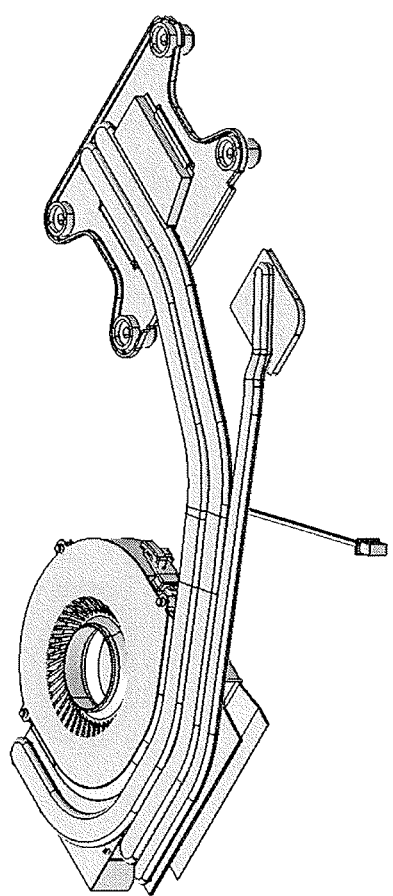
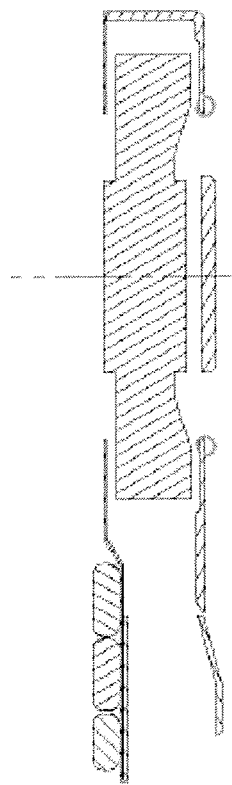
FIG. 10A
FIG. 10B

FIG. 10E

| Embodiment D | Before | After | △ |
|---|---|---|---|
| Low [25dB(A)] | 3450rpm | 3600rpm | +150rpm |
| Middle [28dB(A)] | 3800rpm | 3950rpm | +150rpm |
| High [32dB(A)] | 4500rpm | 4700rpm | +200rpm |

FIG. 11

Effectiveness

| Products | Blades | Low (25dB) | Middle (28dB) | High (32 dB) | CPU (deg. C) |
|---|---|---|---|---|---|
| Embodiment A | 25 | +150rpm | +250rpm | +100rpm | -3 deg. C |
| Embodiment B | 25 | +150rpm | +50rpm | +150rpm | -2.8 deg. C |
| Embodiment C | 21 | +150rpm | +250rpm | +150rpm | -2.5 deg. C |
| Embodiment D | 37 | +150rpm | +150rpm | +200rpm | -3 deg. C |

FLOW RECTIFYING COOLING APPARATUS AND A METHOD FOR RECTIFYING FLOW IN A COOLING APPARATUS

FIELD OF THE INVENTION

The subject invention is directed to a cooling apparatus and a method for cooling an electronic device. More specifically, the subject invention is directed to a cooling apparatus that rectifies flow turbulence in a cooling fluid and a method for rectifying turbulent fluid flow inside a cooling apparatus.

BACKGROUND

Electronic devices such as laptop computers generally require a cooling apparatus to remove heat generated by its electronic circuitry. In a conventional cooling apparatus, an impeller unit may be used to create a fluid pressure gradient to move a cooling fluid, such as air, across a portion of the electronic devices. The movement of the fluid across the portion of the electronic device removes heat generated by the operation of the electronic circuitry in that portion.

In laptop computers, for example, a conventional cooling apparatus produces excessive audible noise while operating to cool the computer circuitry. Such excessive audible noise may be attributed to turbulent airflow inside the cooling apparatus. A conventional cooling apparatus, however, does not adequately reduce the excess noise while operating. Doing so generally requires additional components that increase the space and weight requirement for the cooling apparatus or increase the cost of manufacture.

SUMMARY OF THE INVENTION

At least one embodiment of the present invention comprises a cooling apparatus comprising an internal space for accommodating an electronic circuit to be cooled, a first inlet opening for permitting a fluid to enter the cooling apparatus, a first exhaust opening for permitting the fluid to exit the cooling apparatus, and an impeller unit to increase a pressure of the fluid; wherein the impeller unit comprises a second inlet opening for permitting the fluid to enter the impeller unit, a second exhaust opening for permitting the fluid to exit the impeller unit, an impeller that rotates about an axis, and a projection that impedes the fluid as it enters the impeller unit through the second inlet opening such that a turbulence of the fluid is reduced as the fluid flows towards the second exhaust opening.

DESCRIPTION OF THE DRAWINGS

FIG. 11 depicts a summary data table describing the effectiveness of the various embodiments.

DETAILED DESCRIPTION OF THE PREFERRED EMBODIMENTS

Figure 1:
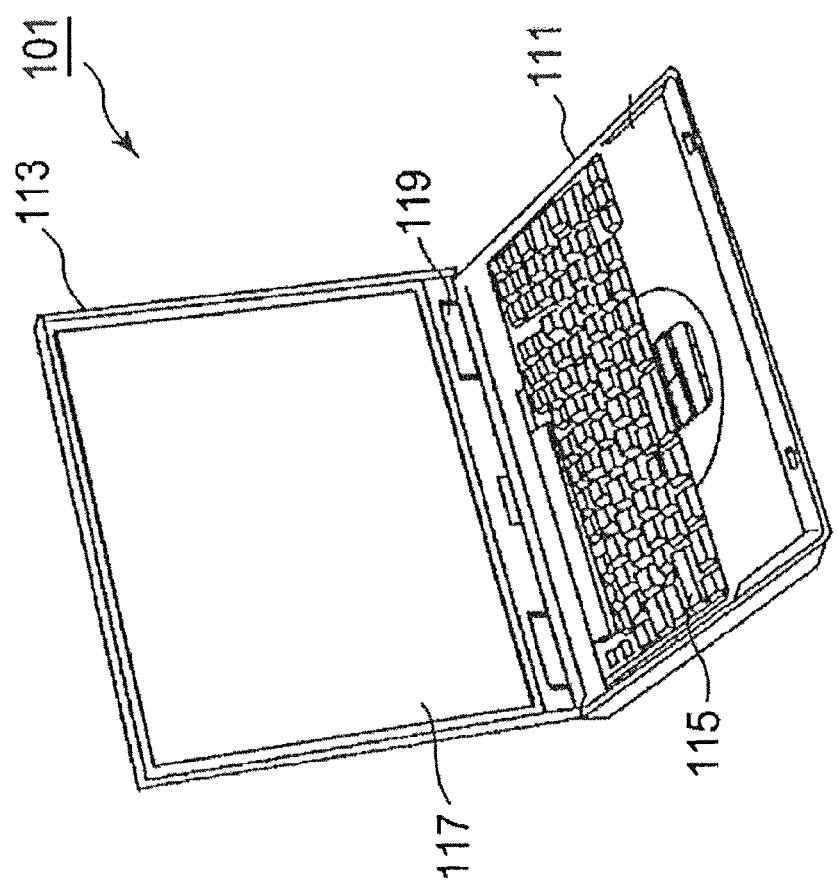
FIG. 1 depicts a perspective view of a notebook personal computer according to an embodiment of the present invention.

An embodiment of the present invention is described hereinafter with reference to the accompanying drawings. FIG. 1 depicts a perspective view of a notebook personal computer (PC) 101 according to an embodiment. The notebook PC 101 includes a main body housing 111 and a display housing 113. The main body housing 111 includes an input section 115, comprising a keyboard and a pointing device, and the display housing 113 comprises a display 117. Furthermore, the main body housing 111 and the display housing 113 are coupled with each other through coupling portions 119 at respective ends. The main body housing 111 and the display housing 113 can swivel in directions along which they are opened/closed. When the main body housing 111 and the display housing 113 are closed, the input section 115 and the display 117 are covered by the display housing and main body housing, respectively.

Figure 2:
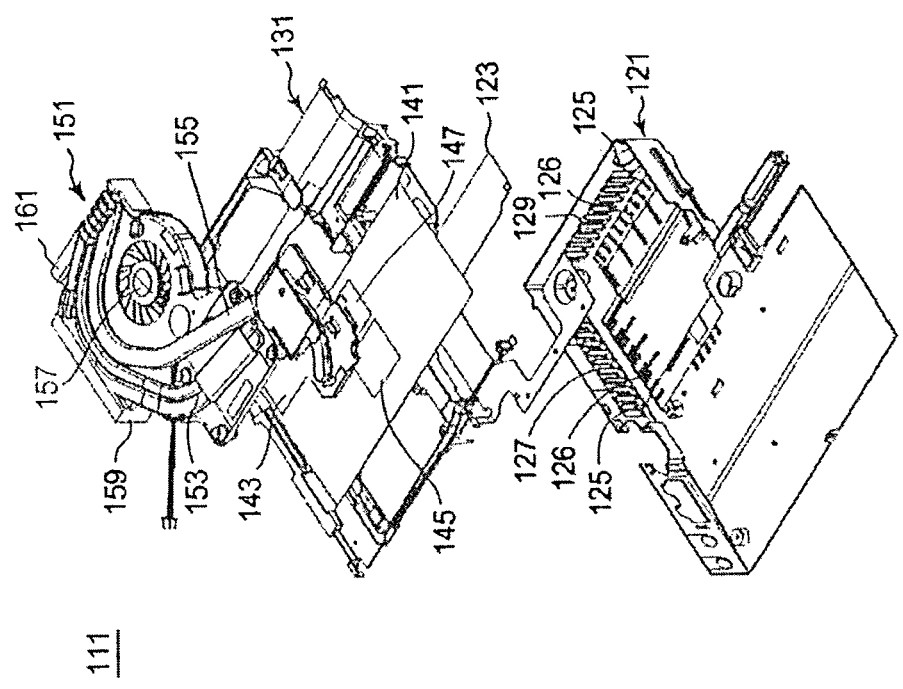
FIG. 2 depicts an exploded perspective view showing the inside of a main body housing according to the embodiment.

FIG. 2 depicts an exploded perspective view showing an inside portion of the main body housing 111. In particular, FIG. 2 depicts an assembly of components around a cooling apparatus 151. A metal plate 123 is attached to a bottom surface of a base cover 121, which constitutes a bottom portion of an exterior of the main body housing 111. A frame 131 is arranged on the plate 123, and a circuit board 141 is disposed on the frame 131. Inlet openings 125 are formed below a position of the bottom surface of the base cover 121 to which the plate 123 is attached, and an air gap is formed between the bottom surface of the base cover 121 and the plate 123. Therefore, outside air can be taken into the main body housing 111 through the inlet openings 125 via the air gap.

Again referring to FIG. 2, an electronic circuit is mounted on the circuit board 141. The circuit can include a number of integrated electronic components that serve central functions of the notebook PC 101. For example, a CPU 143, a video chip 145, a CPU bridge 147, or a main memory (not shown), or others may be disposed. Additionally, although not depicted in FIG. 2, other components may be disposed on the frame 131. For example, a hard disk drive (HDD), an optical drive, a PC card slot, a power supply device, or terminals for connection with a peripheral device or a network through various kinds of interfaces.

According to a preferred embodiment, a cooling apparatus 151 is arranged on the frame 131 and the circuit board 141. The cooling apparatus 151 includes heat pipes 153 and 155, an impeller unit 157, heat sinks 159 and 161, and others. The heat pipe 153 is configured to conduct heat generated by the CPU 143 to the heat sinks 159 and 161. The heat pipe 151 is configured to conduct heat generated by the video chip 145 and the CPU bridge 147 to the heat sinks 159 and 161. The impeller unit 157 and the heat sinks 159 and 161 are arranged on the metal plate 123.

The impeller unit 157 comprises a motor, a centrifugal impeller, and a duct that houses them. Inlet openings are formed on upper and lower sides of the duct. As shown in FIG. 2, exhaust openings 127 are formed in the base cover 121 on the left side of the main body housing 111 in FIG. 2 to direct heat in an exhaust direction from the heat sink 159. Also, exhaust openings 129 are formed in the base cover 121 on the right side of the main body housing 111 in FIG. 2 to direct heat in an exhaust direction of the heat sink 161. Air in the housing that is sucked from the inlet openings by the impeller unit 157 passes through the heat sinks 159 and 161 to be discharged to the outside through the exhaust openings 127 and 129. Meanwhile, heat absorbed by the heat sinks is diffused into air that passes inside the housing. The frame 131 is configured so as to not inhibit air flow through the exhaust openings 127 and 129.

It should be appreciated that FIGS. 1 and 2 show a simplified set of constituent parts and positional relationships. Many components in addition to those explained above may be included to constitute the notebook PC 101. For simplicity, description of the additional components is omitted. Shapes and assembly methods described above are for illustrative purpose only, and one of ordinary skill in the art will recognize other shapes and assembly methods are included in the scope of the invention.

Figure 3:
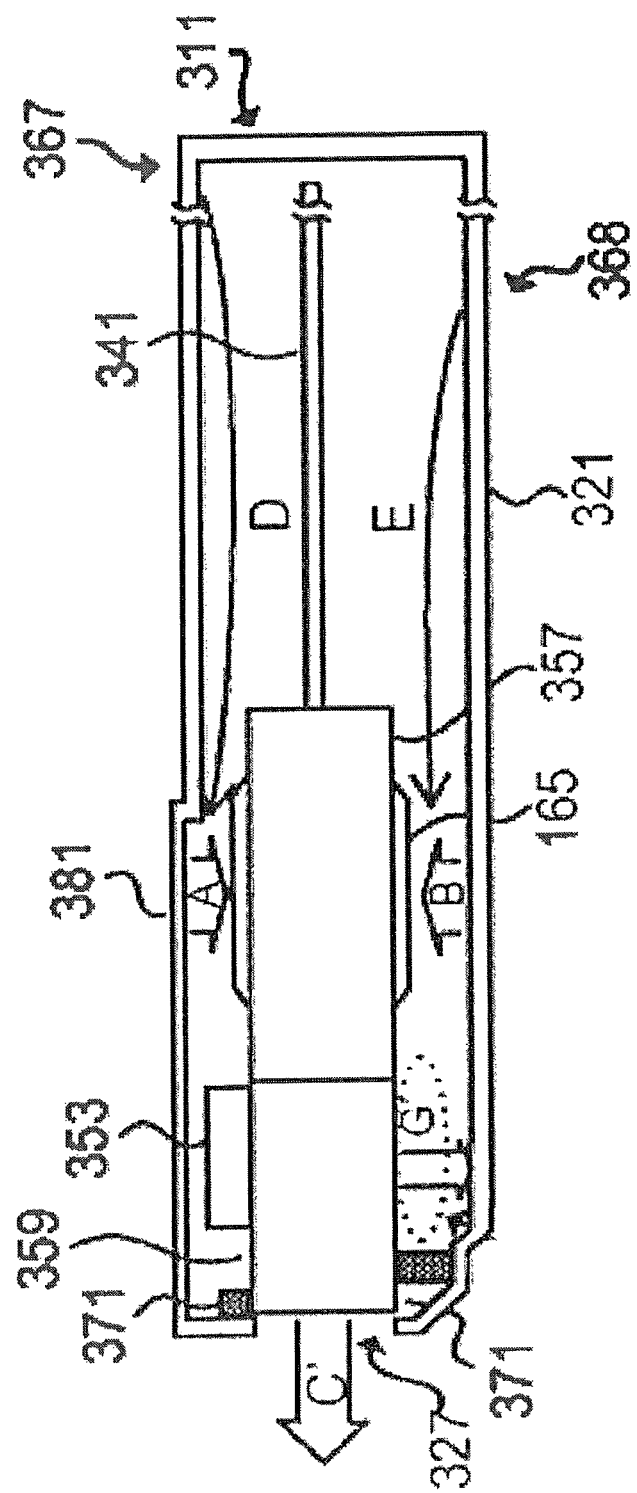
FIG. 3 depicts a cross-sectional view of a cooling apparatus according to the embodiment of the present invention.

FIG. 3 depicts a cross-sectional view of a cooling apparatus in a conventional notebook PC and a flow of air around the cooling apparatus. The cooling apparatus includes a heat sink 359, a heat pipe 353, and an impeller unit 357 accommodated in a housing 311. The heat pipe 353 transmits heat from a semiconductor device (not shown) having a large amount of heat generation, such as a CPU or a video chip, to the heat sink 359. The impeller unit 357 takes in air in the housing from an upper side and a lower side as indicated by an arrow A and an arrow B, and discharges air from an exhaust opening 327 through the inside of the heat sink 359 as indicated by an arrow C. The heat sink 359 diffuses heat transmitted through the heat pipe 353 into air passing through the inside of the heat sink.

A periphery of the exhaust opening 327 is hermetically sealed by a sealing material 371 to prevent high-temperature air that is passing through the heat sink 359 from flowing back into the housing 311. Inlet openings 367 and 368 are provided at respective positions in a top cover 381 and a base cover 321. Since the housing 311, excluding the inlet openings 367 and 368, is substantially hermetically sealed, outside air flows in through the inlet openings 367 and 368 to produce air currents indicated by arrows D and E when the impeller unit 357 operates. The air currents cool each semiconductor device on a circuit board 341 or other devices in the housing 311.

The cooling apparatus shown in FIG. 3 allows a negative pressure to form in the housing 311 to take in outside air through the inlet openings 367 and 368, and discharge air to the outside of the housing through the heat sink 359.

Figure 4:
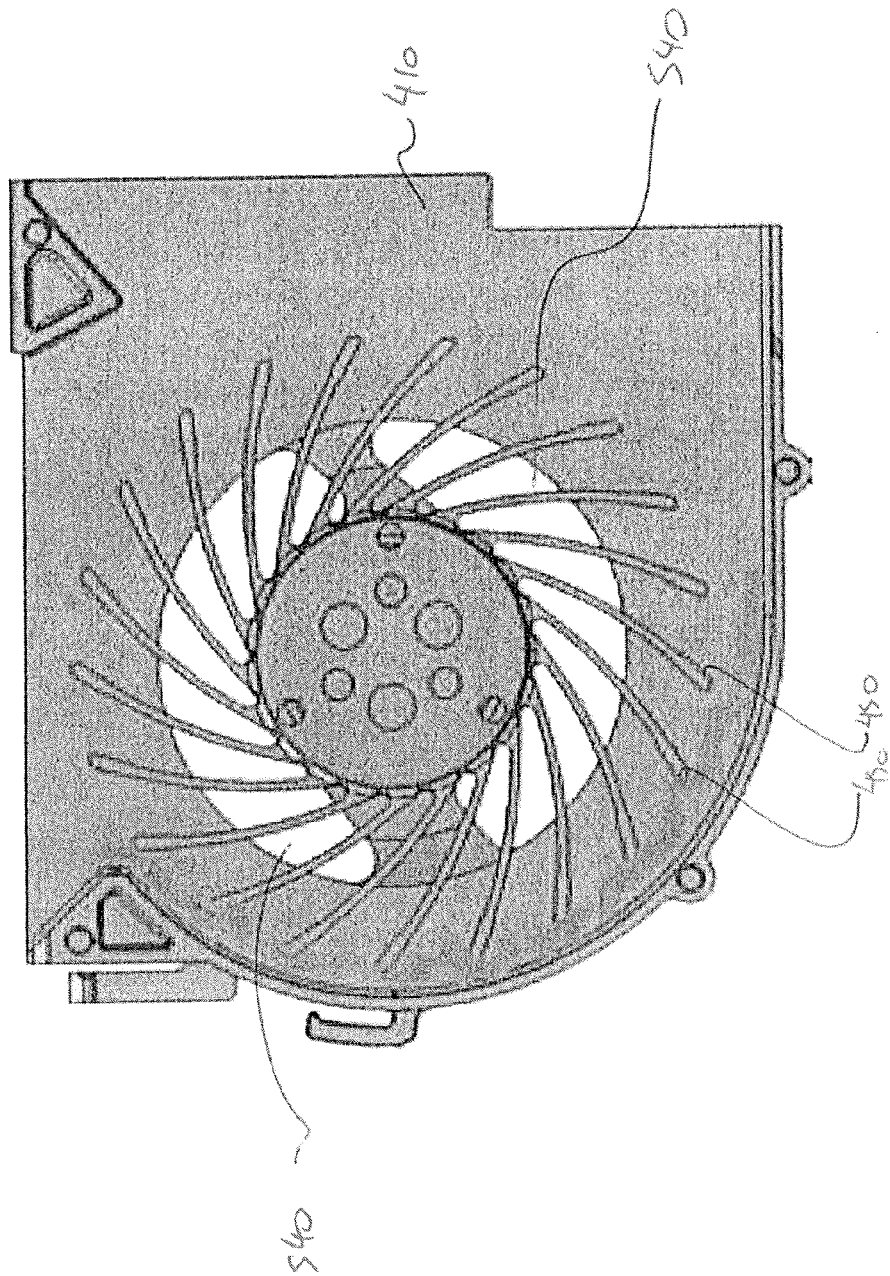
FIG. 4 depicts a top view of an impeller unit according to the embodiment.

FIG. 4 depicts a top view of an impeller unit 357 according to a preferred embodiment. As shown, a top portion of the housing has been removed to reveal the arrangement of the impeller and a bottom portion 410 of the housing. Impeller blades 450 are arranged to project in a radial direction from a rotational center of the impeller. The bottom portion of the housing provides two semicircular inlet openings 540 that permit air to flow from inside the cooling apparatus, which surrounds the impeller unit, into the impeller unit.

Figure 5:
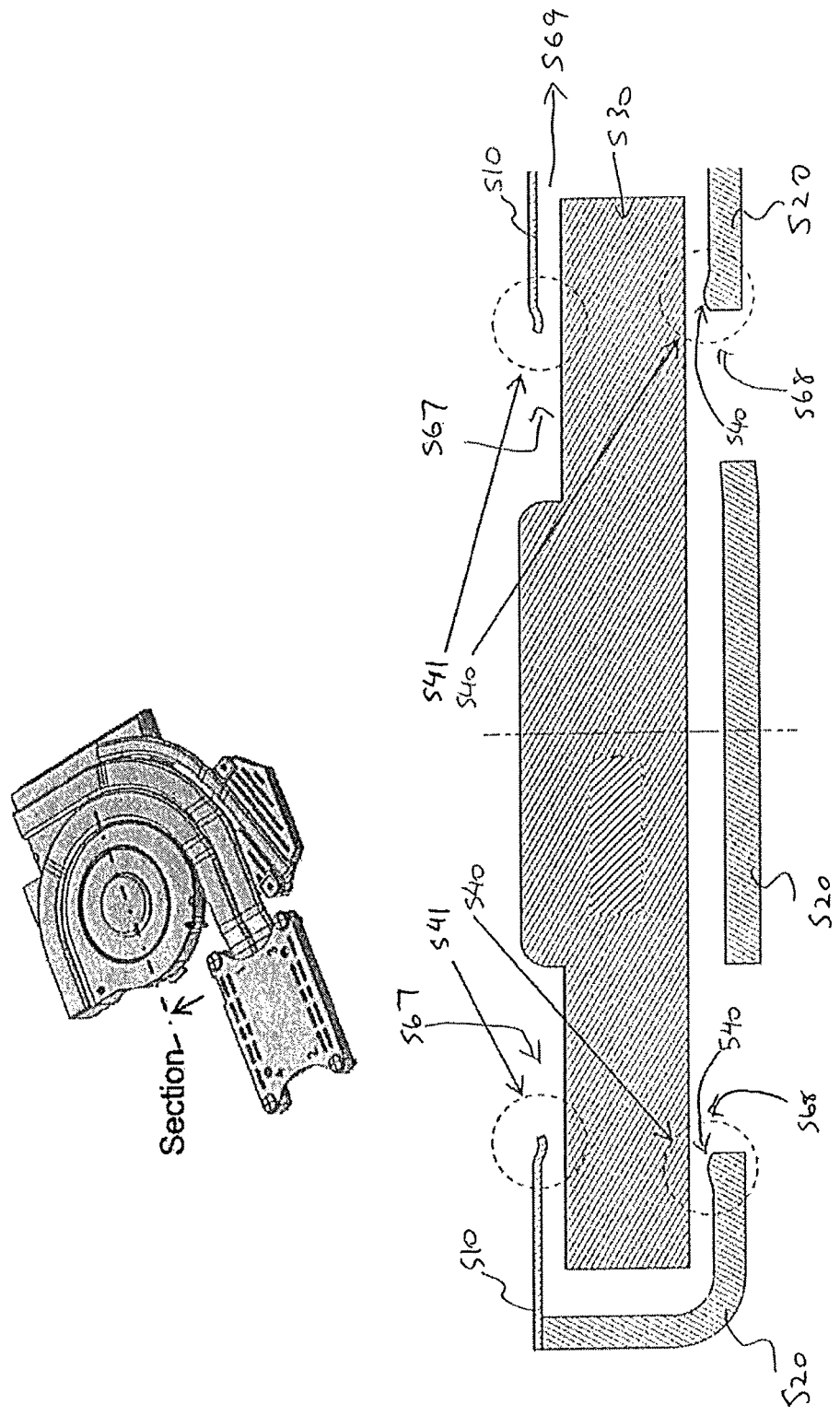
FIG. 5 depicts a vertical cross section of the impeller unit according to the embodiment.

FIG. 5 depicts a vertical cross section of the impeller unit 357. A housing 511 encloses the impeller 530. As shown, the housing 511 can comprise upper portion 510 and lower portion 520 but can also include one portion. According to one embodiment, the upper portion 510 is formed with a metallic sheet and the lower portion 520 is formed with molded plastic. Impeller 530 is positioned between the upper and lower portions and rotates about axis 532. Air enters the housing 511 through inlet openings 567 and 568 formed between the housing 511 and the impeller 530 and exits through exhaust opening 569. Although FIG. 5 shows two openings, the invention is not limited to such. One or more openings may be used.

According to a preferred embodiment, a curved projection 540 is formed on the lower portions 520. But, the projection can be formed on one or both of the lower portion and the upper portion. By cross referencing FIG. 4, where the two semicircular inlet openings are shown, it should be understood that the projection 540 is formed to encircle the two semicircular inlet openings. The projection 540 constricts the air flow that enters the inlet opening. As air flows from the inlet opening 568 in a radial direction away from the inlet openings, the constriction to the air flow created by the projection 540 has been observed to reduce the turbulence, thereby preventing the loss of pressure in the impeller unit. Such reduction in turbulence permits the impeller to be operated at a higher power, e.g. higher rotating speed, and allows for more cooling capacity for a predetermined level of noise. Alternatively, if a predetermined level of cooling capacity is required, the reduction in turbulence provides a corresponding reduction in noise.

Similarly, projection 541 may be formed on the upper portions 510 by deforming the metal sheet material. The inlet opening 567 on the upper portion is generally circular in shape. Accordingly, the projection 541 is formed to encircle the inlet opening 567.

Figure 6:
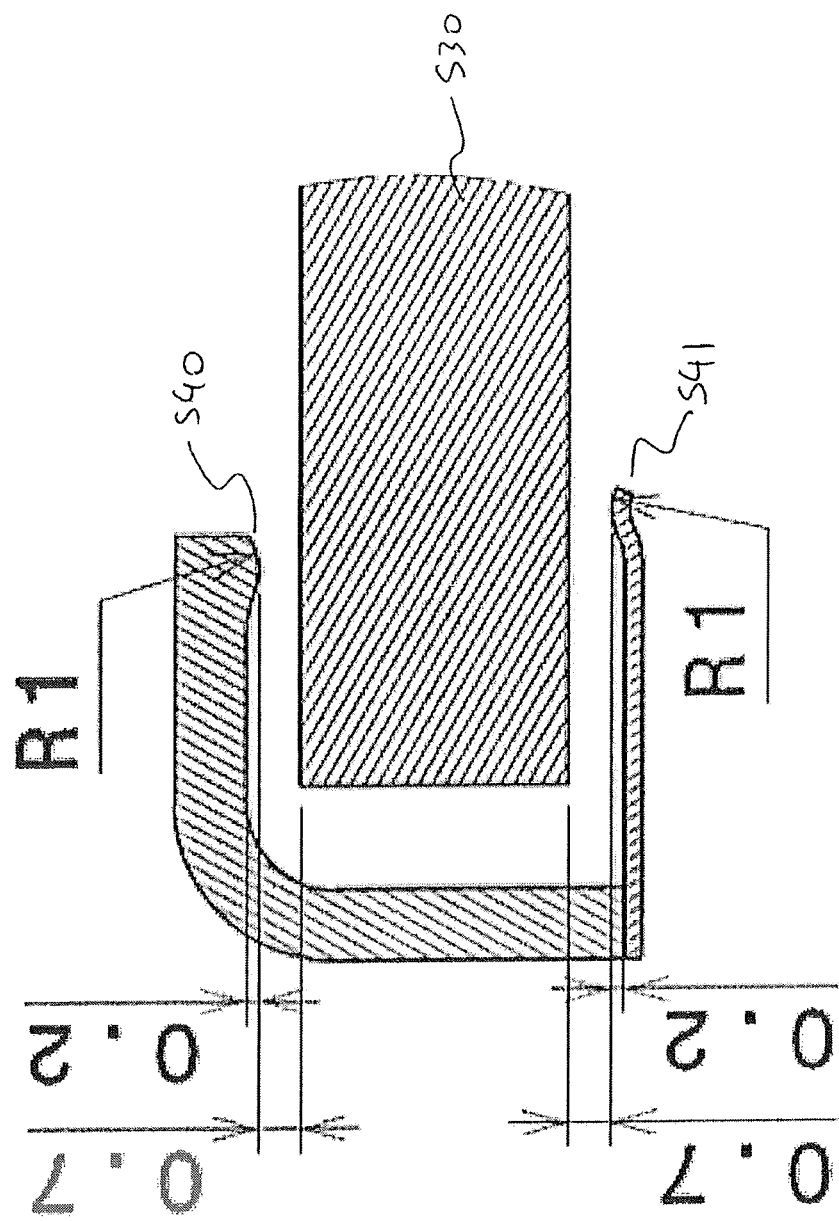
FIG. 6 depicts a detailed view of the cross section of the impeller unit according to the embodiment, as shown in FIG. 5.
Figure 7A:
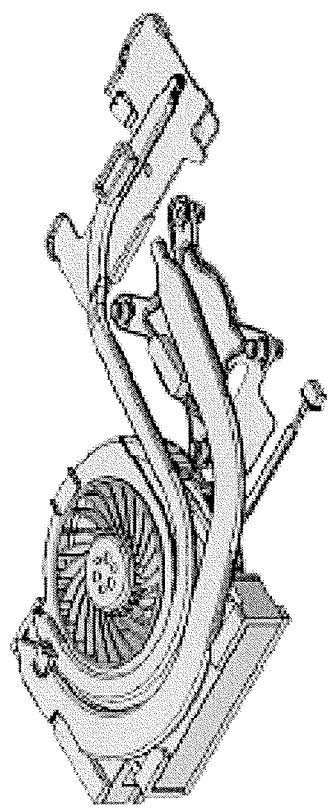
FIGS. 7-10 (A-E) depict a series of embodiments A-D.
Figure 7B:
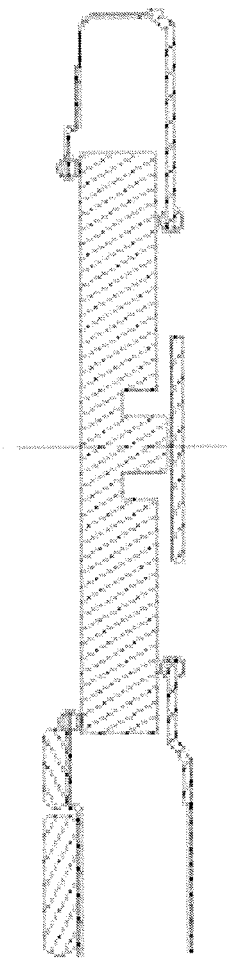
Figure 7C:
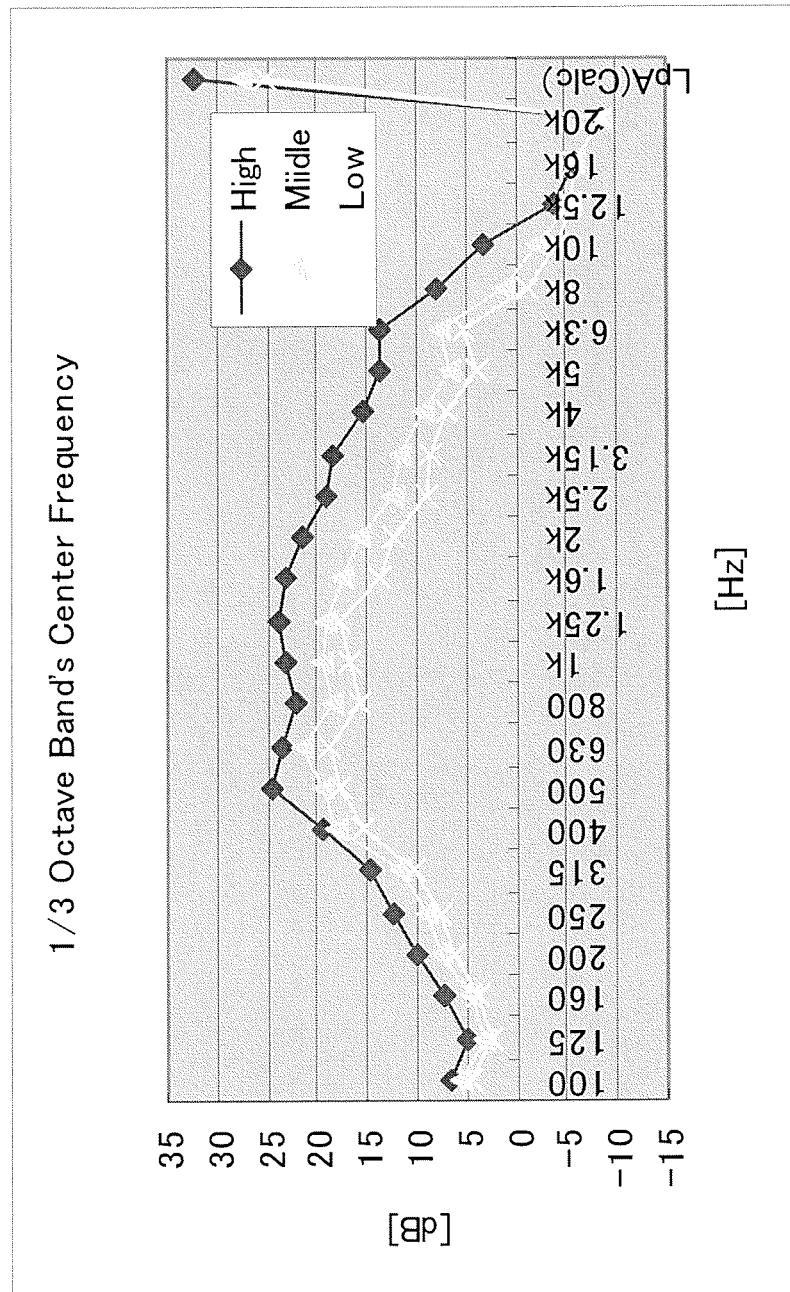
Figure 7D:
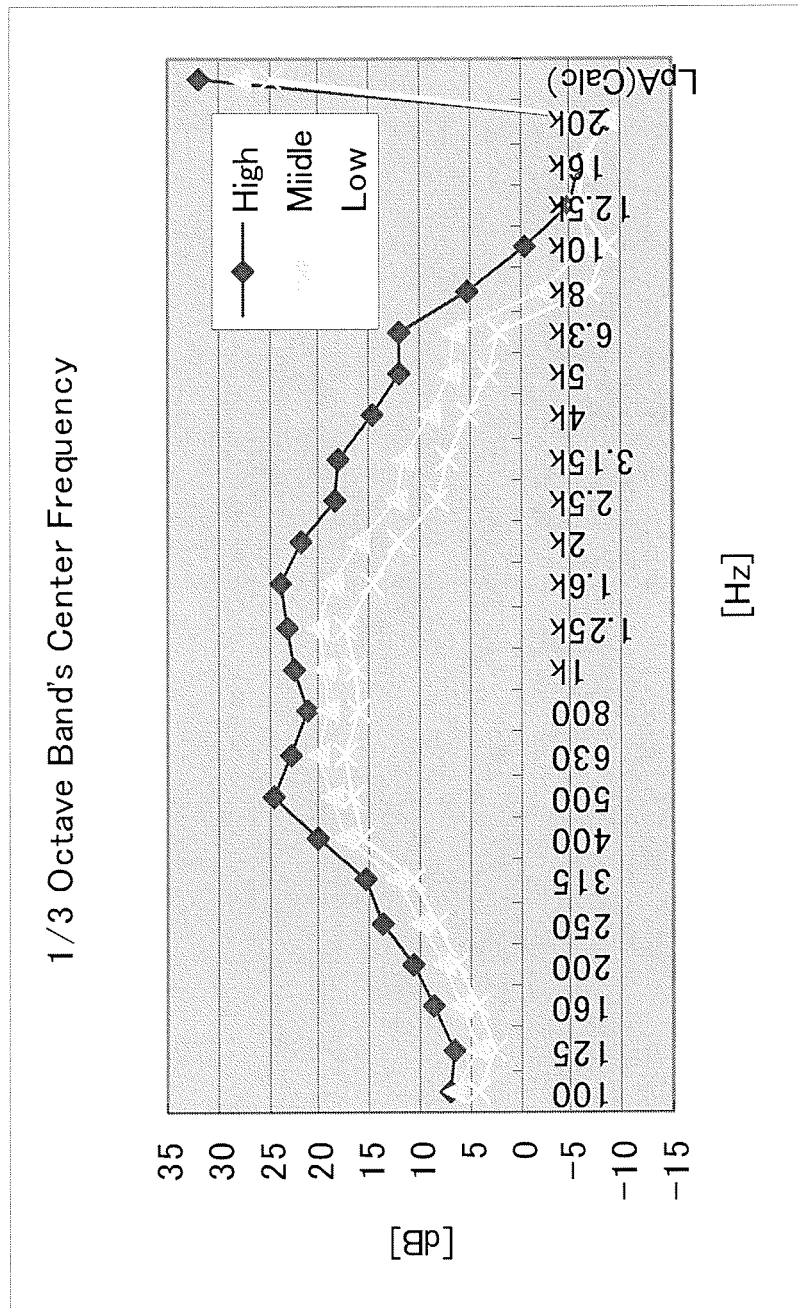
Figure 8A:
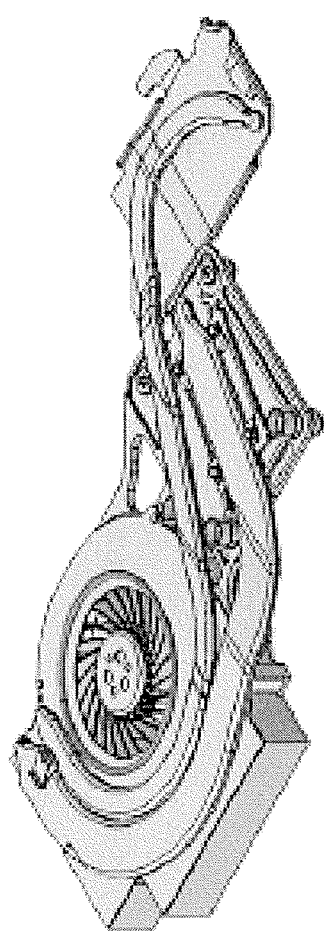
Figure 8B:
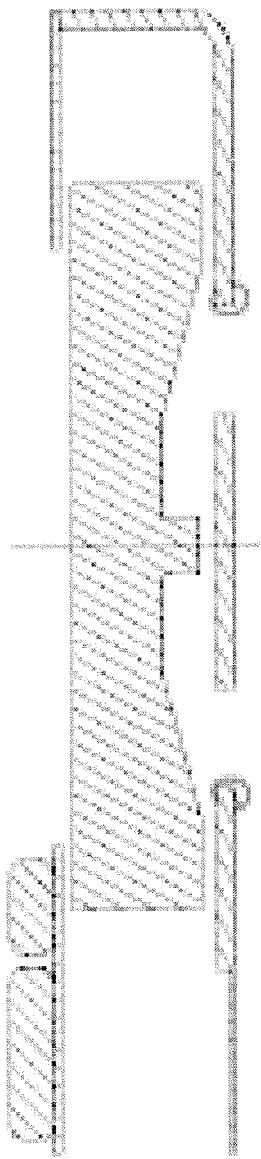
Figure 8C:
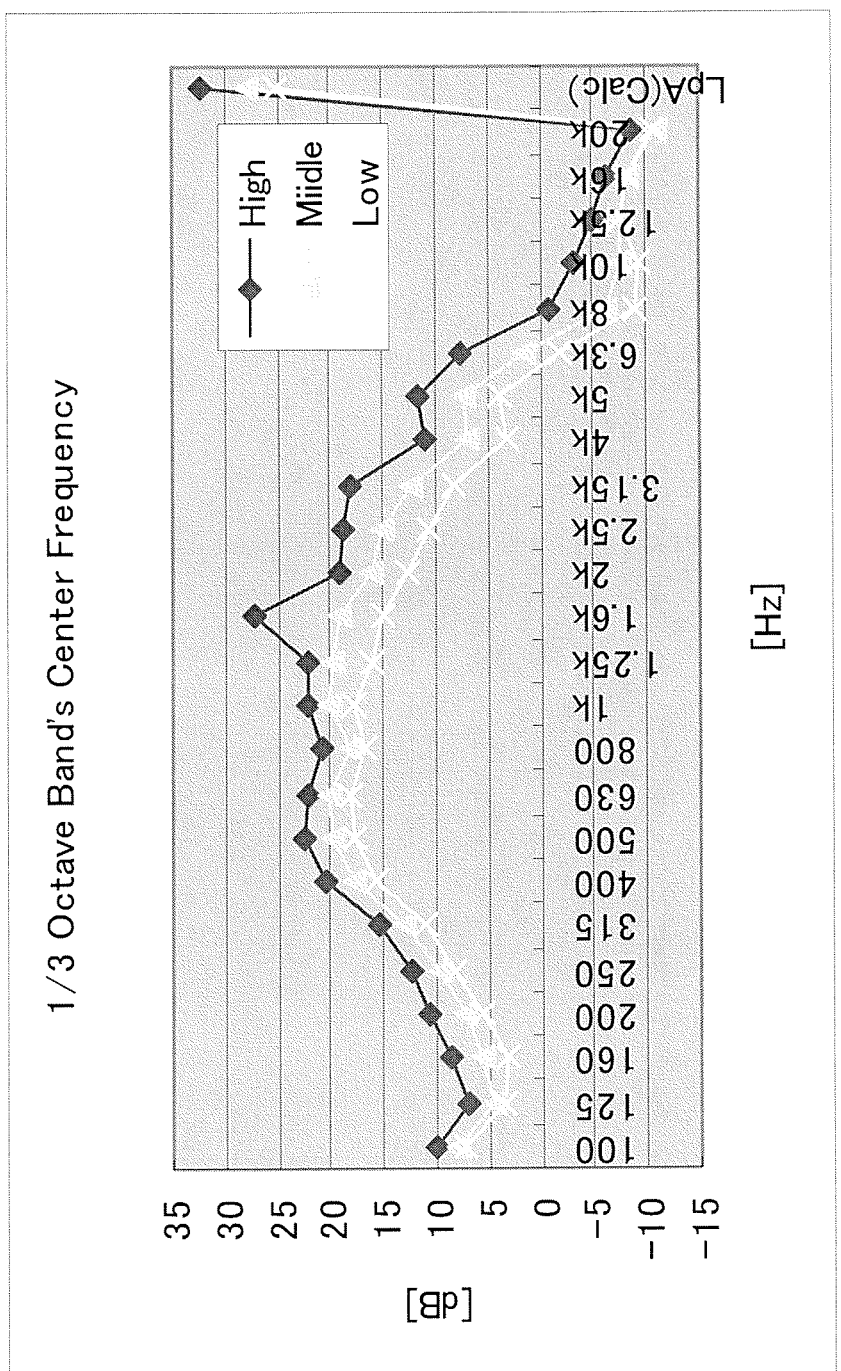
Figure 8D:
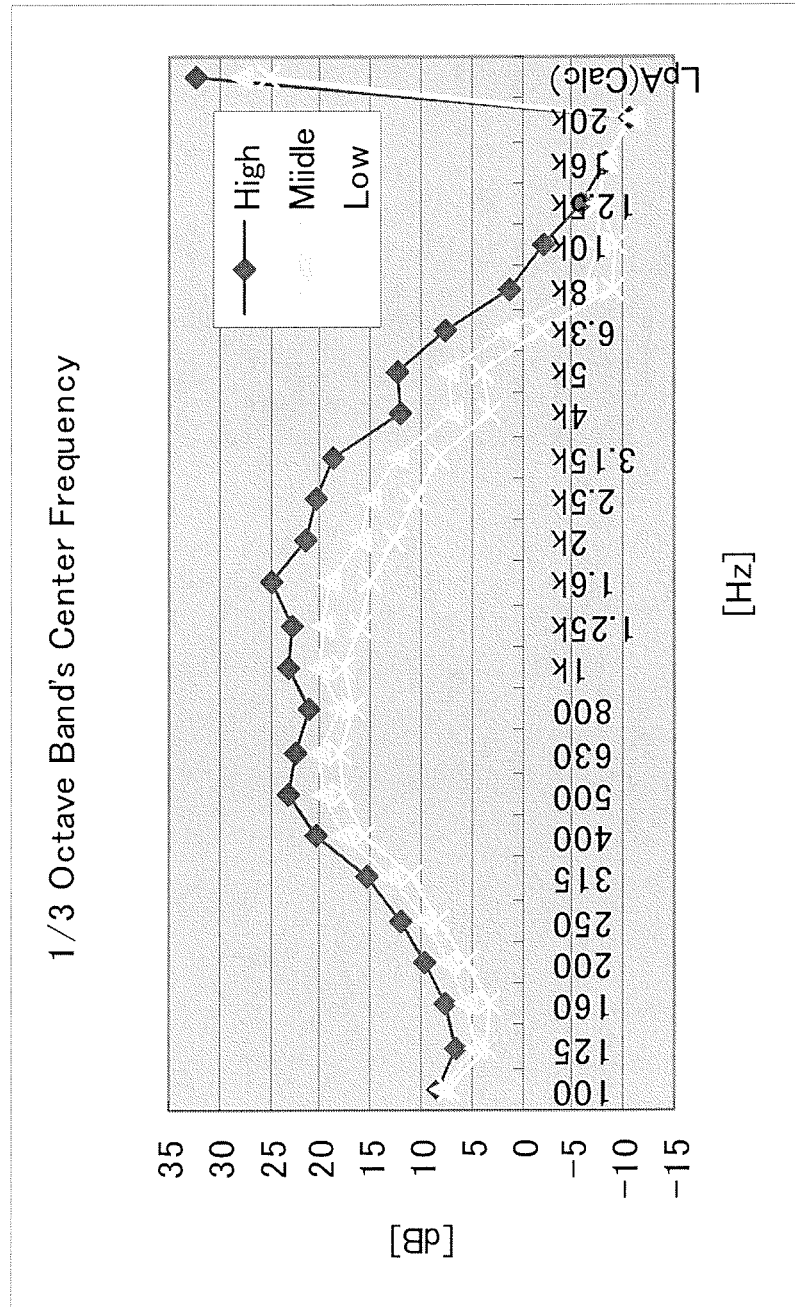
Figure 9A:
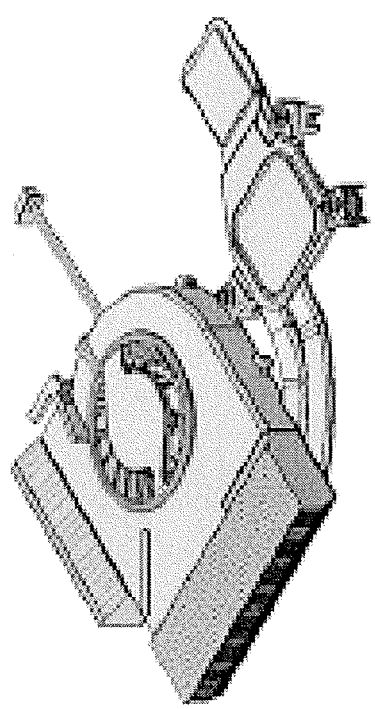
Figure 9B:
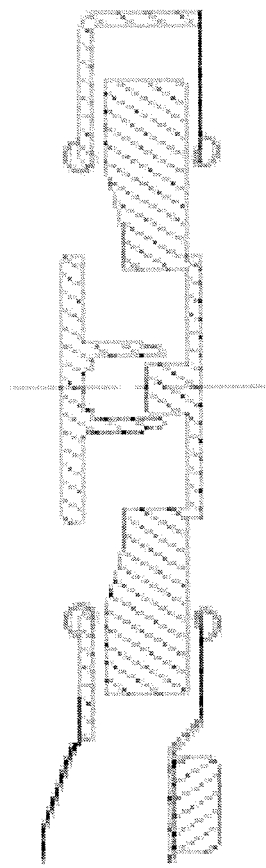
Figure 9C:
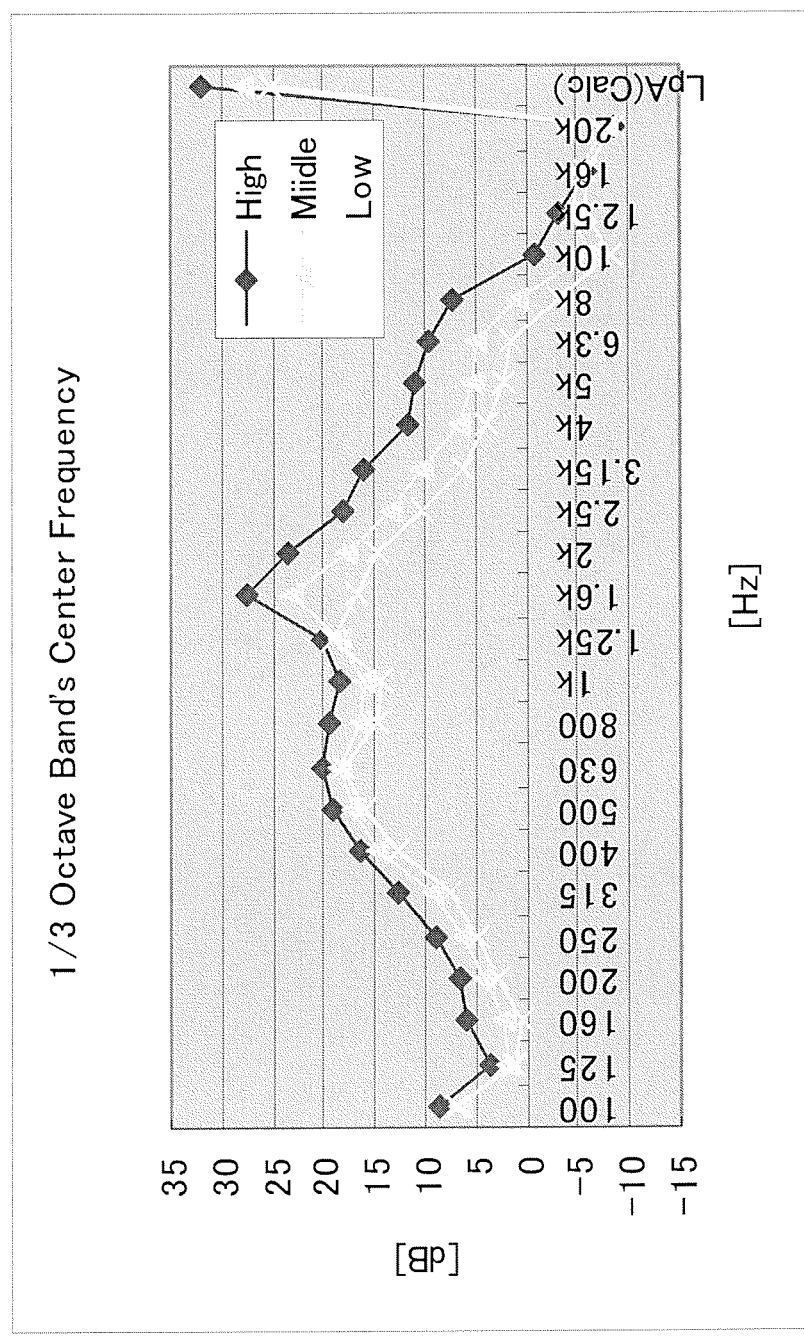
Figure 9D:
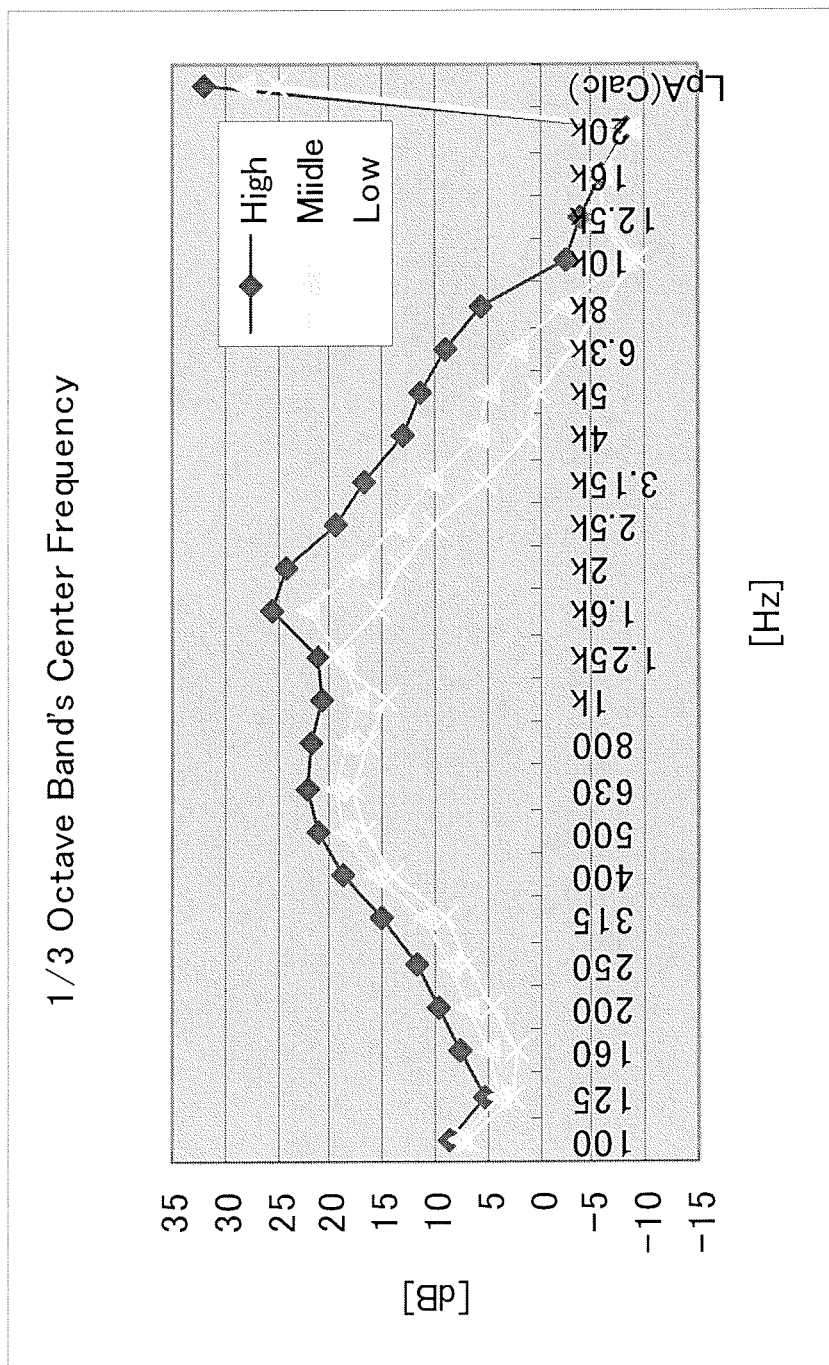
Figure 10C:
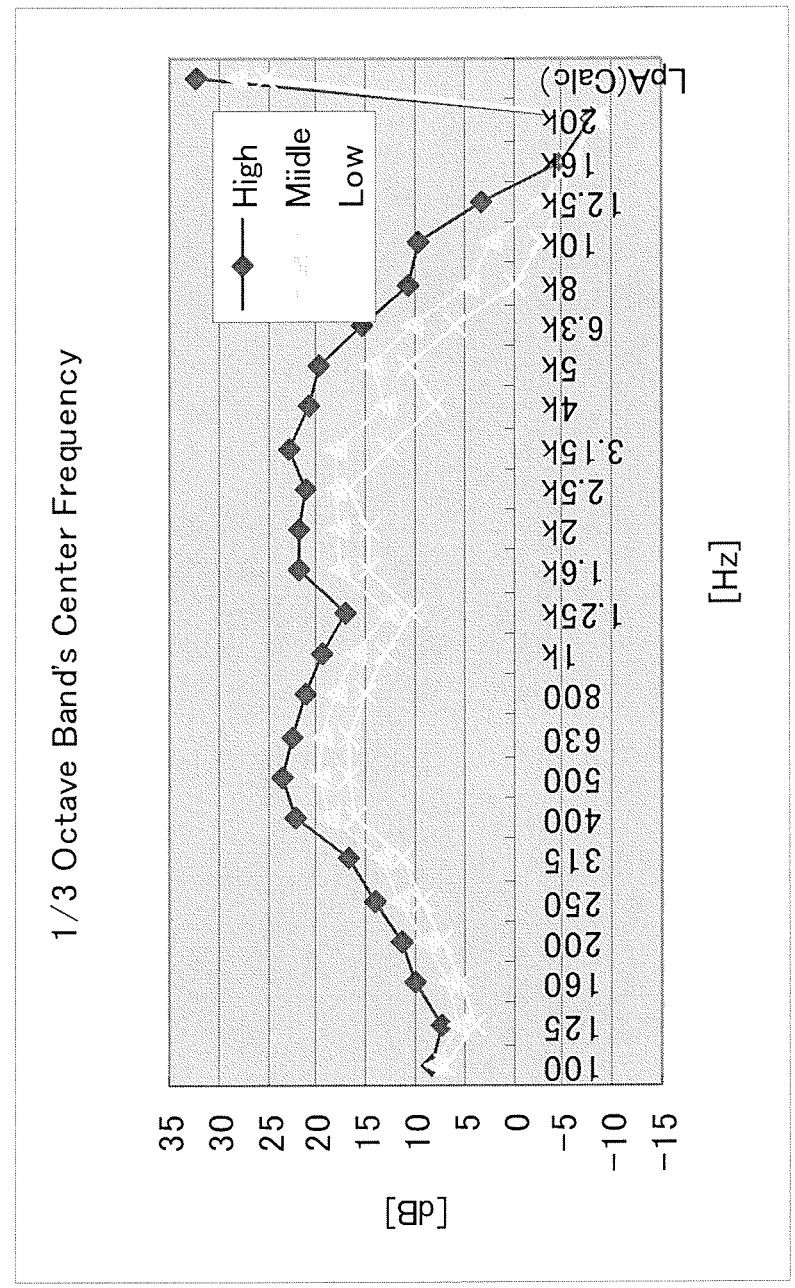
Figure 10D:
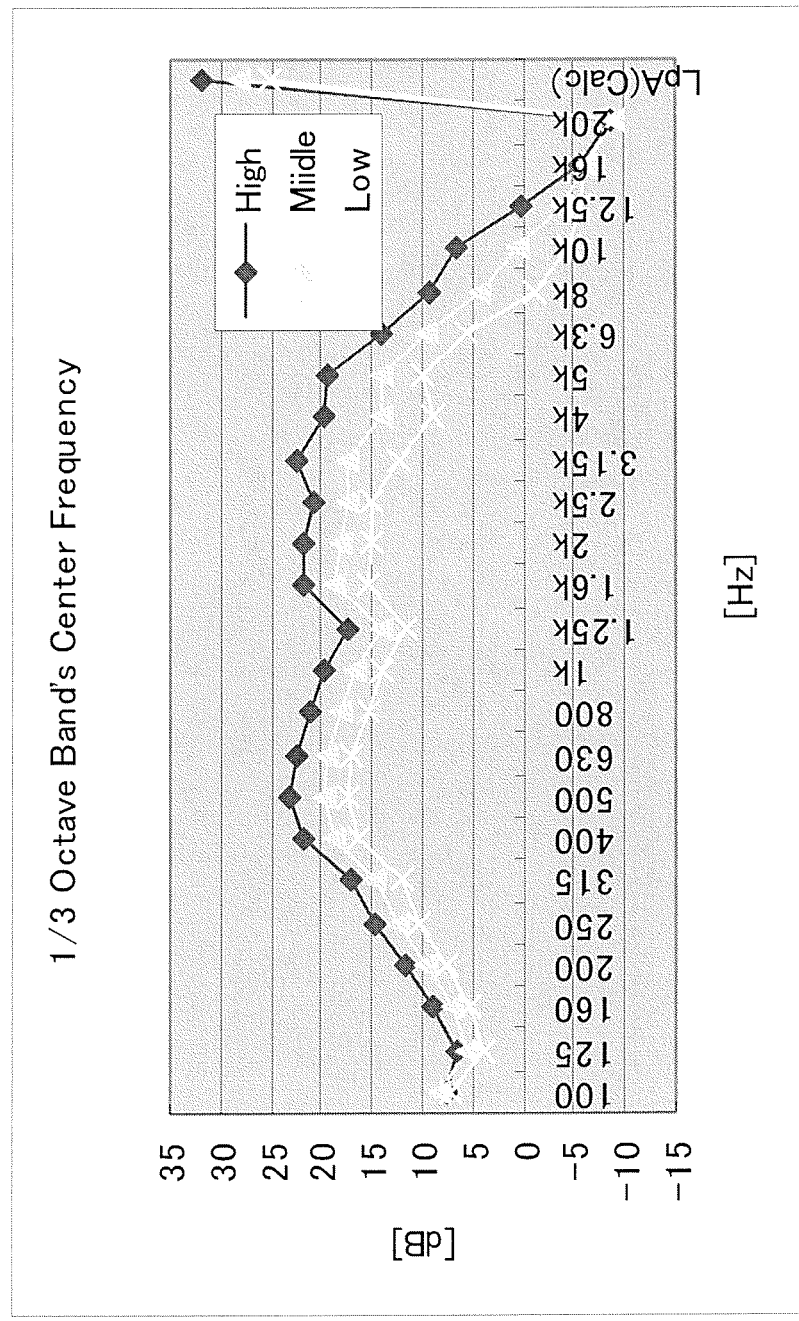

FIG. 6 depicts a preferred embodiment of the projections 540 and 541. In particular, the projections 540 and 541 constricts the air flow path by substantially 0.2 centimeter while the narrowest point of the air flow path provides a flow path of substantially 0.7 centimeter diameter.

FIGS. 7-10 (including A-E for each of FIGS. 7-10) depict a series of embodiments A-D, each of which comprises an existing OEM cooling fan assembly that is modified according to another aspect of the subject invention. Each of FIGS. 7A, 8A, 9A, and 10A depicts a perspective drawing of embodiments A, B, C, and D. respectively. Each of embodiments A, B, C, and D comprises an OEM cooling fan assembly with a cross section view shown in FIGS. 7B, 8B, 9B, and 10B. In particular, each of the embodiments A, B, C, and D comprises a distinct combination of impeller shape and upper and lower inlets, as shown in FIGS. 7B, 8B, 9B, and 10B.

Furthermore, FIGS. 7C, 8C, 9C, and 10C depict a time series plot of impeller noise (dB) against impeller speeds (rpm) prior to being modified according to the subject invention. FIGS. 7D, 8D, 9D, and 10D depict a time series plot of impeller noise (dB) against impeller speeds (rpm) after being modified according to the subject invention.

Finally, each of FIGS, 7E, 8E, 9E, and 10E provides a data table that summarizes the improvement of the subject invention over their respective unmodified OEM cooling fan assemblies. For example. FIG. 7E shows that for a predetermined low noise requirement of 23 dB(A), the modification according to the subject invention provides a 150 rpm increase over the unmodified OEM fan assembly.

FIG. 11 depicts a data table that summarizes the effectiveness of the modifications according to the subject invention in embodiments A-D. In particular, the data table aggregates the data tables in FIGS. 7E, 8E, 9E, and 10E. The data table further provides an alternative measure of the effectiveness of the modifications according to the subject invention in embodiments A-D. For example, as shown in the last column of FIG. 11, a CPU temperature in embodiments A-D is reduced by 3, 2.8, 2.5 and 3 degrees Celsius, respectively, while the noise level is held at 32 dB.

What is claimed is:

1. An apparatus, comprising:
   an internal space for accommodating an electronic circuit to be cooled;
   a first inlet opening for permitting a fluid to enter a cooling apparatus;
   a first exhaust opening for permitting the fluid to exit the cooling apparatus; and an impeller unit to increase a pressure of the fluid;
wherein the impeller unit comprises:
  a second inlet opening for permitting the fluid to enter the impeller unit;
  a second exhaust opening for permitting the fluid to exit the impeller unit;
  an impeller that rotates about an axis;
  a housing that encloses the impeller; and
  a projection extending from a terminal end of the housing, the projection having one of a semicircular cross section and an elliptical cross section such that the terminal end of the housing protrudes into the second inlet opening, the projection impeding the fluid as it enters the impeller unit through the second inlet opening such that a turbulence of the fluid is reduced as the fluid flows towards the second exhaust opening.

2. The apparatus of claim 1, wherein the fluid enters the inlet along an impeller rotational axis and is accelerated by the impeller to flow in a radial direction outwards from the impeller rotational axis into a diffuser chamber.

3. The apparatus of claim 2, wherein the fluid exits the diffuser chamber through the exhaust opening into a downstream piping unit.

4. The apparatus of claim 1, wherein a portion of the impeller unit is formed with a metallic sheet.

5. The apparatus of claim 1, wherein a portion of the impeller unit is formed with molded plastic.

6. The apparatus of claim 4, wherein the projection is formed as an indentation in the metallic sheet.

7. The apparatus of claim 5, wherein the projection is formed in a same molding process as the portion of the impeller.

8. A method of cooling an electronic device, comprising:
  providing an internal space for accommodating an electronic circuit to be cooled;
  forming a first inlet opening for permitting a fluid to enter a cooling apparatus including a housing enclosing an impeller;
  forming a first exhaust opening for permitting the fluid to exit the cooling apparatus;
  permitting the fluid to enter the housing through a second inlet opening;
  permitting the impeller to rotate to increase a pressure of the fluid in the housing;
  permitting the fluid to exit the housing through a second exhaust opening; and
  impeding the fluid as it enters the housing through the second inlet opening with a projection extending from a terminal end of the housing, the projection having one of a semicircular cross section and an elliptical cross section such that the terminal end of the housing protrudes into the second inlet opening.

9. An apparatus comprising:
an impeller;
a housing having opposed upper and lower portions, the housing enclosing the impeller between the upper and lower portions;
a first inlet opening formed between the upper portion of the housing and the impeller;
a first projection formed on the housing that extends from the upper portion of the housing towards the impeller such that the first projection projects into the first inlet opening;
a second inlet opening formed between the lower portion of the housing and the impeller; and
a second projection formed on the housing that extends from the lower portion of the housing towards the impeller such that the second projection projects into the second inlet opening wherein at least one of the first and second projections has one of a semicircular cross section and an elliptical cross section such that a terminal end of the housing from which the at least one of the first and second projections extends protrudes into the inlet opening.

10. The apparatus of claim 9, wherein the upper portion is formed with a metallic sheet and the lower portion is formed with molded plastic.

11. A computer comprising:
an internal space for accommodating an electronic circuit to be cooled;
a first inlet opening for permitting a fluid to enter a cooling apparatus;
a first exhaust opening for permitting the fluid to exit the cooling apparatus; and
an impeller unit to increase a pressure of the fluid;
wherein the impeller unit comprises:
  a second inlet opening for permitting the fluid to enter the impeller unit;
  a second exhaust opening for permitting the fluid to exit the impeller unit;
  an impeller that rotates about an axis;
  a housing that encloses the impeller; and
  a projection extending from a terminal end of the housing, the projection having one of a semicircular cross section and an elliptical cross section such that the terminal end of the housing protrudes into the second inlet opening, the projection impeding the fluid as it enters the impeller unit through the second inlet opening such that a turbulence of the fluid is reduced as the fluid flows towards the second exhaust opening.

12. A computer comprising:
an impeller;
a housing having opposed top and bottom sides, the housing enclosing the impeller between the top and bottom sides;
a first inlet opening formed between the top side of the housing and the impeller;
a first projection formed on the housing that extends from the top side of the housing towards the impeller such that the first projection projects into the first inlet opening;
a second inlet opening formed between the bottom side of the housing and the impeller; and
a second projection formed on the housing that extends from the bottom side of the housing towards the impeller such that the second projection projects into the second inlet opening wherein at least one of the first and second projections has one of a semicircular cross section and an elliptical cross section such that a terminal end of the housing from which the at least one of the first and second projections extends protrudes into the inlet opening.

13. The apparatus of claim 1, wherein the fluid flows in a flow path between the second inlet opening and the second exhaust opening, the projection constricts the flow path by substantially 0.2 centimeters, and the flow path has a substantially 0.7 centimeter diameter.

14. The apparatus of claim 1, wherein the one of the semicircular cross section and the elliptical cross section is a solid cross-sectional shape.

15. The computer of claim 11, wherein the fluid flows in a flow path between the second inlet opening and the second exhaust opening, the projection constricts the flow path by substantially 0.2 centimeters, and the flow path has a substantially 0.7 centimeter diameter.

16. The computer of claim 11, wherein the one of the semicircular cross section and the elliptical cross section is a solid cross-sectional shape.

\* \* \* \* \*